(12) United States Patent
Guedon

(10) Patent No.: US 6,377,126 B1
(45) Date of Patent: Apr. 23, 2002

(54) CURRENT FEEDBACK AMPLIFICATION CIRCUIT AND ASSOCIATED PROCESS

(75) Inventor: Yannick Guedon, Sassenage (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/587,957

(22) Filed: Jun. 6, 2000

(30) Foreign Application Priority Data

Jun. 7, 1999 (FR) .............................................. 99 07150

(51) Int. Cl.$^7$ ................................................. H03F 3/04
(52) U.S. Cl. ...................... 330/288; 330/265; 348/707
(58) Field of Search ................................. 330/265, 267, 330/268, 288; 348/707

(56) References Cited

U.S. PATENT DOCUMENTS

| | | | |
|---|---|---|---|
| 3,942,129 A | * 3/1976 | Hall | 330/29 |
| 4,431,972 A | 2/1984 | Ishii et al. | |
| 5,418,495 A | * 5/1995 | Harvey | 330/265 |
| 5,420,542 A | * 5/1995 | Harvey | 330/292 |
| 5,479,133 A | * 12/1995 | Dow | 330/267 |
| 5,578,967 A | * 11/1996 | Harvey | 330/263 |
| 5,614,866 A | * 3/1997 | Dow | 330/267 |

OTHER PUBLICATIONS

Nelson, James et al. "OP AMPS For Wideband, Fast Settling Applications", XP002130631, vol. 30, Nov. 18–20, 1996, pp. 15/4 1–13 15/4 9.
French Search Report dated Feb. 16, 2000 with Annex to French Application No. 99–07150.

* cited by examiner

*Primary Examiner*—Robert Pascal
*Assistant Examiner*—Henry Choe
(74) *Attorney, Agent, or Firm*—Lisa K. Jorgenson; Jon A. Gibbons; Fleit, Kain, Gibbons, Gutman & Bongini P.L.

(57) ABSTRACT

Electronic circuit comprising a first and a second current mirrors, an upstream active element arranged between an input of the first current mirror and an input of the second current mirror, each current mirror being provided with an output. The circuit comprises a first current source arranged in parallel with the input of the first current mirror and a second current source arranged in parallel with the input of the second current mirror, so that the current delivered to the active element is equal to the output current of each current mirror and that the input current of each current mirror is less than the current delivered to the active element by the input of each current mirror and by the associated current source.

16 Claims, 3 Drawing Sheets

CURRENT FEEDBACK AMPLIFICATION CIRCUIT AND ASSOCIATED PROCESS

CROSS-REFERENCE TO RELATED APPLICATIONS

This application is based upon and claims priority from prior French Patent Application No. 99-07150, filed Jun. 7, 1999, the entire disclosure of which is herein incorporated by reference.

BACKGROUND OF THE INVENTION

1. Field of the Invention

The present invention relates to the field of amplifiers, especially those used in the field of video.

2. Description of Related Art

There are two popular types of amplifiers used in the field of video, voltage feedback amplifiers and current feedback amplifiers. Voltage feedback amplifiers comprise two high-impedance inputs, into one of which, a voltage tapped off at the output is reinjected back into the input. However, this type of amplifier has a relatively limited slew rate, especially by virtue of the bias currents of each branch which must charge the capacitors present in the circuit.

Amplifiers with current feedback have a high-impedance input into which is the data signal is received and a low-impedance input into which a current tapped off at the output is reinjected. These amplifiers have a high slew rate by virtue of the possibility of reinjecting a large output current.

An exemplary embodiment of a prior art amplifier with current reinjection is illustrated in FIG. 1. The circuit comprises two current mirrors 1 and 2 provided respectively with an input 1a, 2a and with an output 1b, 2b. Each current mirror 1, 2 is capable of outputting a current proportional to the input current. The proportionality factor is equal for the two mirrors 1 and 2 and denoted K. Between the inputs 1a and 2a of the current mirrors 1 and 2 are arranged in series a PNP type bipolar transistor 3 and an NPN type bipolar transistor 4. The collector of the transistor 3 is linked to the input 1a and the emitter of transistor 3 is linked to the collector of the transistor 4. The emitter of the transistor 4 is linked to the input 2a. Two diodes 5 and 6 are arranged in series between the base of the transistor 3 and the base of the transistor 4. The input of the circuit into which the signal to be amplified is injected is linked to the common point between the diodes 5 and 6. A current source 7 is also linked to the base of the transistor 3, and a current source 8 is linked to the base of the transistor 4. The current sources 7 and 8 deliver an identical current denoted 10 serving to bias the diodes 5 and 6.

The outputs 1b and 2b of the current mirrors 1 and 2 are short-circuited and linked to the input of an amplifier 9, in general of unity gain whose output forms the output of the amplifier circuit and whose role is to deliver a low output impedance. Capacitors 10 and 11 are arranged in series between the current mirror 1 and the current mirror 2, their common point being linked to the input of the amplifier 9. Finally, the emitter of the bipolar transistor 3 is on the one hand linked to ground by way of an external resistor R12 and on the other hand to the output of the current amplifier 9 by way of an external resistor R13. The inputs 1a and 2a of the current mirrors 1 and 2 deliver a current $I_O$. The outputs 1b and 2b deliver a current $K \times I_O$. The operation of the circuit can be modeled by the following equations:

Denoting by $G_0$ the gain of the feedback loop, yields:

$$G_0 = 1 + R13/R12.$$

The −3 db cutoff frequency is equal to:

$$F_{3db} = K/(2 \times p \times R13 \times C)$$

with C the sum of the values of the capacitors 10 and 11, the capacitor 11 and the capacitor 10 having equal values.

Combining the equations for $G_0$ and $F_{3db}$, the cutoff frequency $$F_C = F_{-3db}/(1 + r_0 \times Go/R13)$$

with $r_0$ the input resistance of the transistors 3 and 4 seen with a small signal:

$$r_0 = u_t/(2 \times Io)$$

$u_t$ being a constant equal to 26 mV at 27° C. with $u_t = (k \times T)/q$, k being Boltzmann's constant, T the temperature in Kelvin and q the charge on the electron.

The complex transimpedance of the circuit equal to the ratio of an output voltage variation to an input current variation is expressed as follows: $T_Z = \Delta V_S/\Delta I = K \times R_{HZ}$, the term $R_{HZ}$ being the input resistance of the feedback loop seen from the input of the amplifier 9, with $R_{HZ} = V_{EA}/(K \times Io)$, with $V_{EA}$ a characteristic voltage of the transistors 3 and 4 and which is the theoretical voltage for which the collector current would be zero, this voltage being obtained by extending the straight parts of the curves representative of the collector current as a function of the voltage between the collector and the emitter, which voltage is called the Early voltage. Accordingly, $T_Z = V_{EA}/Io$. Thus, it may be seen that the complex transimpedance of the circuit is independent of the factor K and depends only on the characteristics of the transistors 3 and 4 and on the current $I_O$. To increase the complex transimpedance, one must therefore try to decrease the current $I_O$. If $I_O$ deceases, then $r_0$ increases since $$r_0 = u_t/(2 \times Io)$$

Now, the cutoff frequency $$F_C = F_{-3db}/(1 + r_0 \times Go/R13)$$

To keep $F_C$ the same, R13 would have to be increased.

The slew rate denoted SR is governed by the following equation:

$$SR = K \times \Delta V_S/R13/C$$

If the resistance R13 is increased, then the slew rate decreases. If the value C of the capacitors 10 and 11 is decreased, then the stray capacitances of the transistors which exhibit nonlinear characteristics become predominant, thereby tending to exacerbate the distortion of the signal.

Accordingly, what is needed is a circuit that overcomes the shortcomings of above and to provide an amplifier with improved distortion, transimpedance and output excursion while keeping $r_0$, R13, and hence $f_0$ and SR the same.

SUMMARY OF THE INVENTION

The electronic circuit, according to the invention, comprises a first and a second current mirrors, an upstream active element arranged between an input of the first current mirror and an input of the second current mirror, each current mirror being provided with an output. The circuit comprises a first current source arranged in parallel with the input of the first current mirror and a second current source arranged in parallel with the input of the second current mirror, so that the current delivered to the active element is equal to the output current of each current mirror and that the input current of each current mirror is less than the current delivered to the active element by the input of each current mirror and by the associated current source.

In one embodiment of the invention, the circuit forms a current feedback amplifier.

Advantageously, the circuit comprises a downstream element arranged between an output of the first current mirror and an output of the second current mirror. The upstream active element and the downstream element may be connected externally, in particular by way of a first resistor arranged between the output of the upstream active element and the output of the downstream element, a second external resistor being arranged between the output of the upstream active element and ground.

In one embodiment of the invention, the downstream element comprises a pair of capacitors mounted in series between the outputs of the first and of the second current mirrors.

In one embodiment of the invention, the downstream element comprises an amplifier of the unity gain whose input is linked directly to the outputs of the first and of the second current mirrors, so that the circuit exhibits low output impedance. The input of the amplifier can, moreover, be linked to the point common to the two capacitors.

Advantageously, the upstream active element comprises two transistors mounted in series between the inputs of the two current mirrors.

The circuit can comprise two biased diodes mounted in series between the bases of the said two transistors, the common point between the diodes forming the input of the upstream active element.

The subject of the invention is also a process for increasing the transimpedance of an electronic circuit comprising a first and a second current mirrors, an upstream active element arranged between an input of the first current mirror and an input of the second current mirror, each current mirror being provided with an output, in which process a first current is injected in parallel with the input of the first current mirror and a second current is injected in parallel with the input of the second current mirror, so that the total current delivered to the active element is equal to the output current of each current mirror and that the input current of each current mirror is less than the said total current delivered to the active element.

Thus, by arranging two additional current sources, the static data current of the current mirrors is decreased. It is then possible to increase the value C of the capacitors at the input of the output amplifier, thus making it possible to reduce the distortion while increasing the transimpedance. By way of example, provision may be made for the inputs of the mirrors to deliver a current Io/K while each additional current source delivers a current $I_O \times (K-1)/K$. The bipolar transistors thus see the same current $I_O$ and the output of the current mirror also delivers a current $I_O$. The resistance $R_{HZ}$ is proportional to $V_{EA}$, inversely proportional to $I_O$ and independent of K. The transimpedance $T_Z$ is then multiplied by the factor K. It is also possible to choose to keep the value C of the capacitors arranged at the input of the output amplifier constant. The distortion is then unchanged but the value of the transimpedance is still multiplied by the factor K and the output excursion is increased.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF PREFERRED EMBODIMENTS

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 2:
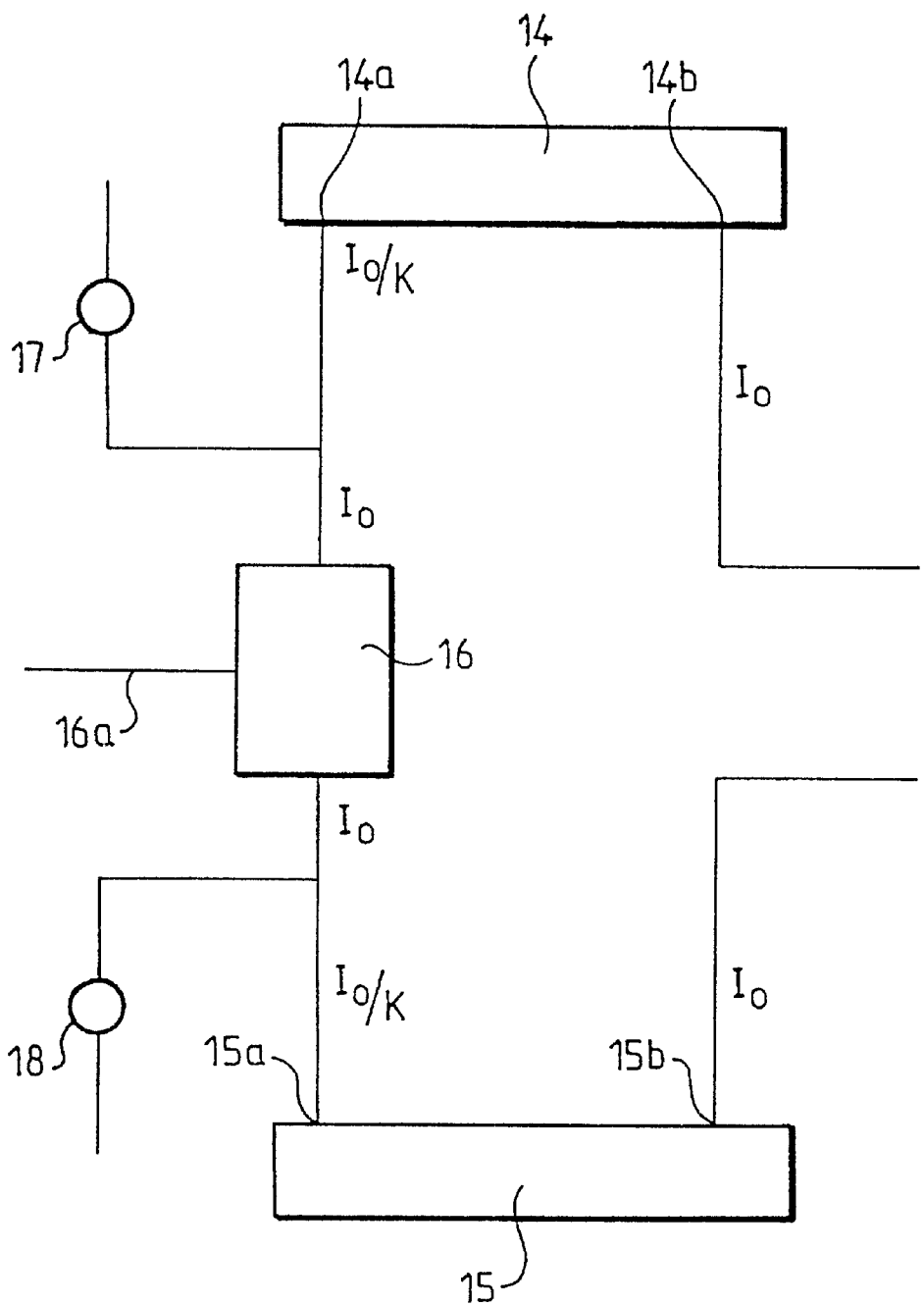
FIG. 2 is a schematic diagram of a circuit for an amplifier, according to the invention.

As may be seen in FIG 2, the circuit comprises two current mirrors 14 and 15, each provided with an input 14a, 15a and with an output 14b, 15b, each output 14b, 15b being able to replicate the current seen at the input with a proportionality factor K. Between the inputs 14a and 15a is arranged an active element 16 which can be composed of one or more transistors, or diodes and of passive elements such an resistors or capacitors, according to the desired function of the circuit. The active element 16 is provided with an input 16a. The output of the circuit can be formed either directly by the outputs 14b, 15b of the current mirrors 14, 15 or by one or more active or passive elements (not represented), possibly with a feedback loop connected to an additional input (not represented), of the active element 16. A current source 17 is connected to the active element 16 in parallel with the input 14a of the current mirror 14. Likewise, a current source 18 is connected to the active element 16 in parallel with the input 15a of the current mirror 15. The current sources 17 and 18 make it possible, while preserving the other characteristics of the circuit, to decrease the currents seen by the inputs 14a and 15a of the current mirrors 14 and 15. The current passing through the active element 16 can be preserved, thereby making it possible not to modify the bias of the transistors which it comprises, while increasing the transimpedance of the circuit. It would of course be possible to contemplate changing the value of the current passing through the active element by increasing or by decreasing that of the current emanating from the current sources 17 and 18 with a view to a different operational setting of the circuit.

Figure 1:
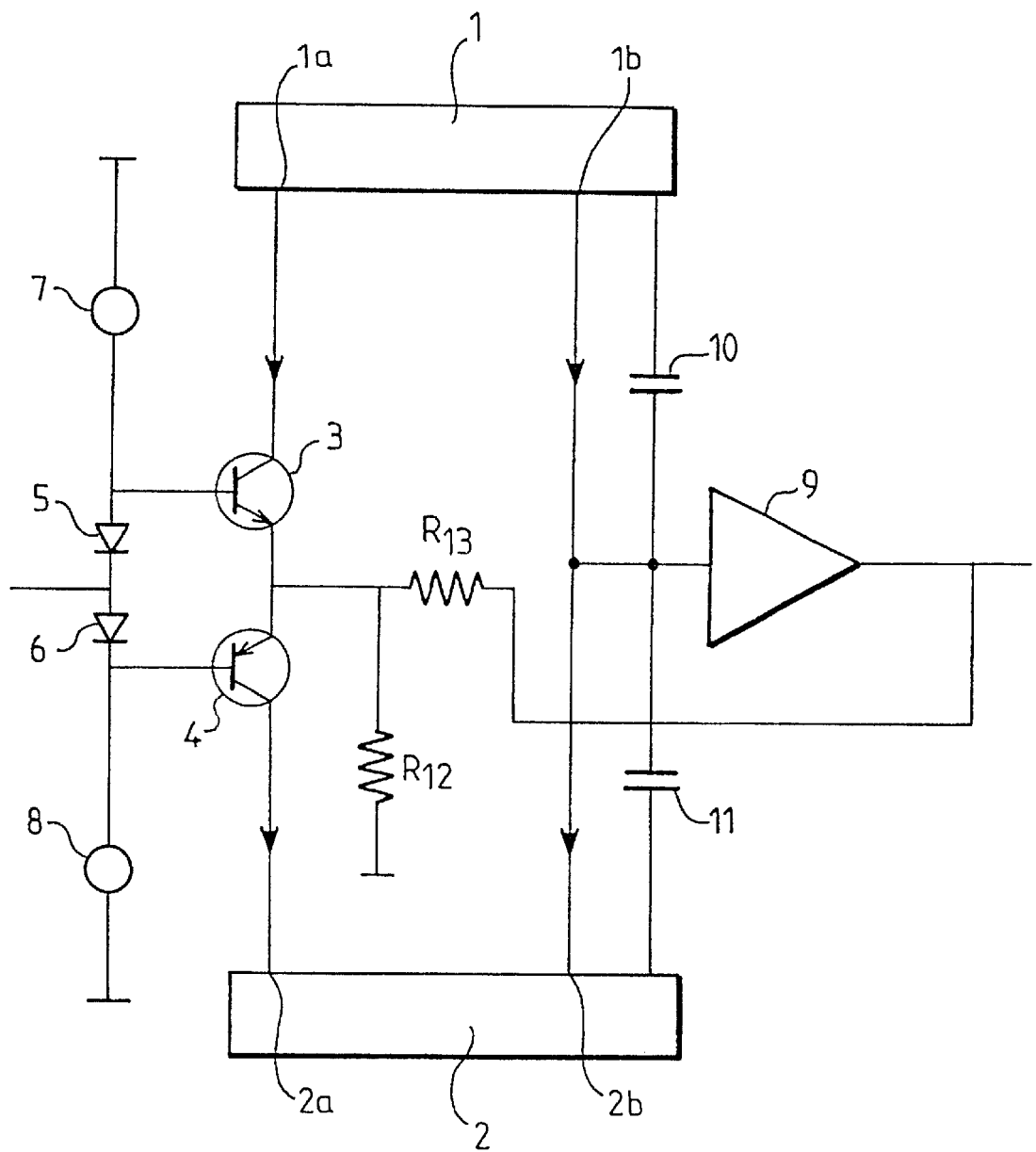
FIG. 1 is a prior art circuit schematic of an amplifier.
Figure 3:
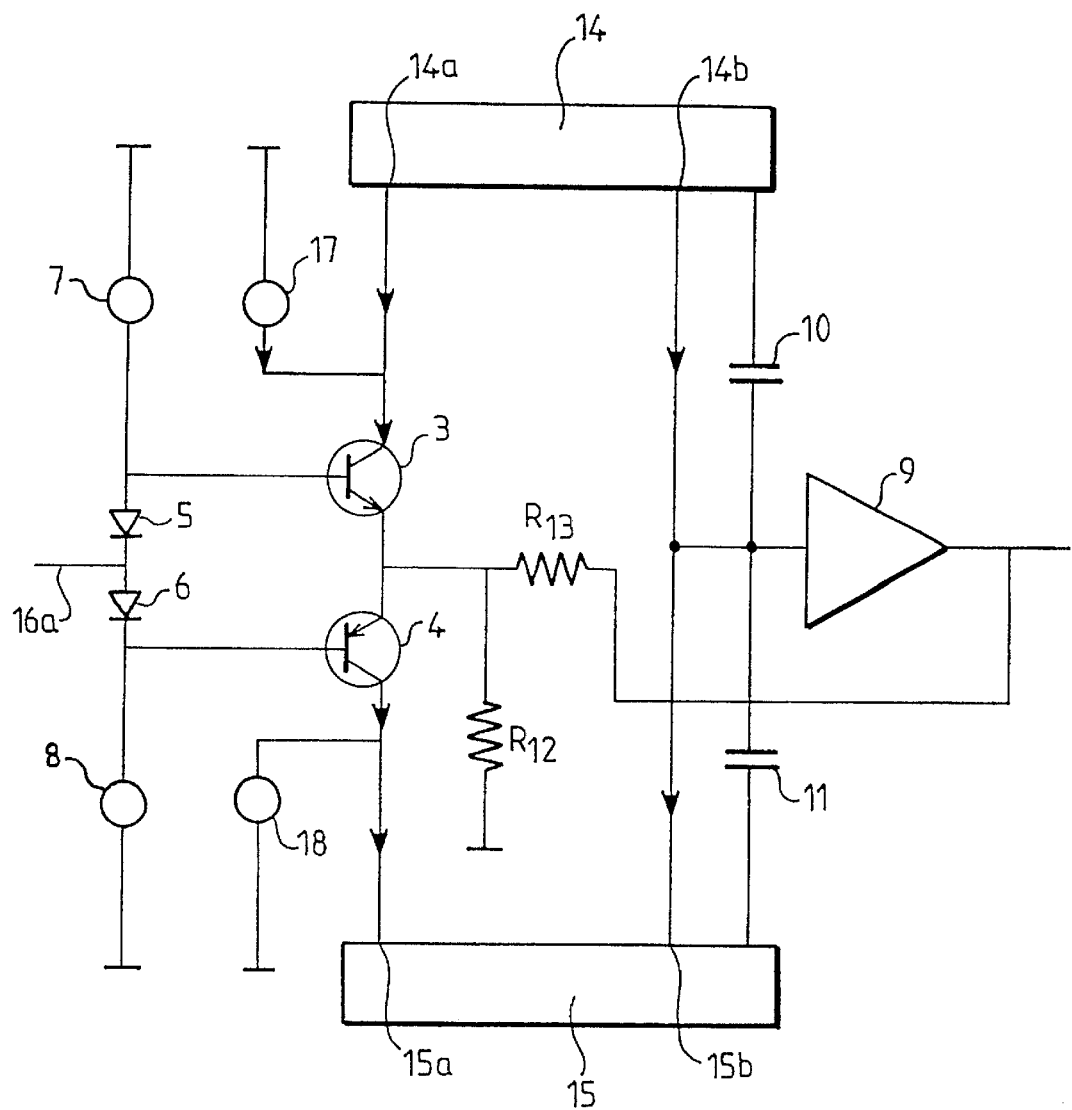
FIG. 3 is a diagram of an amplifier in accordance with the invention.

Illustrated in FIG. 3 is a particular embodiment of the invention which is here adapted to the known circuit illustrated in FIG. 1. The references of similar elements are preserved. The active element is here formed by the transistors 3 and 4 and the diodes 5 and 6. The feedback loop is formed by the resistors R12 and R13. The output element is formed by the unity-gain amplifier 9 and the capacitors 10 and 11.

The outputs 14b and 15b of the mirrors 14 and 15 deliver a current $I_O$, while the inputs 14a and 15a deliver a current Io/K. The current sources 17 and 18 deliver a current $I_O \times X \times (K-1) \times K$. Thus, the transistors 3 and 4 keep the same bias under the current $I_O$. The input resistance of the feedback loop is then independent of the factor K while being proportional only to the voltage $V_{EA}$ and inversely proportional to the current $I_O$. The transimpedance $T_Z$ is then proportional to the coefficient K, and to the voltage $V_{EA}$ and inversely proportional to the current $I_O$. It is now possible to choose K=2 or more, for example. The transimpedance is thus improved, thereby making it possible to reduce the error in the gain of the looped-back amplifier. To preserve the same operation in terms of passband and stability, the value of the capacitors 10 and 11 is increased by a factor K, thereby making it possible to reduce the harmonic distortion. These two advantages are obtained without any increase in consumption, the outputs 14b and 15b of the current mirrors 14 and 15 still delivering the current $I_O$.

In the prior art circuit illustrated in FIG. 1, if one had chosen to increase the coefficient K, one would have been led to increase the capacitances 10 and 11 in the same proportions, and this would have had a positive effect on the reduction in the harmonic distortion, the capacitances 10 and 11 being almost independent of the voltage unlike the junction capacitances. On the other hand, the transimpedance would have remained constant and the consumption of the high impedance branch, stated otherwise the current passing through the outputs 14b, 15b of the current mirrors 14 and 15 would have been increased in the same proportions, this being undesirable for reasons concerned with the dimensioning of the components of the current mirrors and consumption.

In the circuit according to the invention, one needs to choose an emitter area sufficient to produce the transistors belonging to the current mirrors 14 and 15 and delivering the current to their inputs 14a and 15a by reason of high current values which are apt to be reinjected should there be a large variation in voltage on the input of the circuit which is manifested as a reinjected current proportional to the voltage deviation and inversely proportional to the value of the resistor R13, this reinjected current possibly reaching 8 mA for example. It is therefore preferable not to exploit the reduction by the factor K in the value of the current delivered by the inputs 14a and 15a in order to reduce the emitter area of these transistors but on the contrary to keep it unchanged and to use the same emitter areas for the transistors of the two branches of the mirrors 14 and 15.

According to the technology of the bipolar transistors which are used in the current mirrors 14 and 15, the access resistance to the collectors of the PNP transistors and of the NPN transistors may be very different. For example, in HF2C MOS technology, the access resistance to the collector of a PNP transistor will be around 485 Ohms, while that of the NPN transistor may possibly be around 30 Ohms. If the size of the PNP transistor, stated otherwise its silicon area, is increased in order to reduce its access resistance to the collector, then the stray capacitances of the two current mirrors 14 and 15 become different, and this may tend to increase the distortion. Nevertheless, the transimpedance is still improved. This difference in resistance between the PNP and NPN transistors is due to the fabrication process. Moreover, since an NPN transistor exhibits lower stray capacitances than a PNP transistor, an NPN transistor of larger size is then used so that the stray capacitances are balanced, but this then tends to reduce its access resistance to the collector.

By virtue of the invention, it is possible to improve the transimpedance of an electronic circuit using current mirrors while remaining at constant bias and at constant consumption. Seen from the input, the block 16 is biased by a current $I_O$, whereas seen from the output, the block 16 is biased by a current Io/K. The transimpedance is therefore multiplied by the factor K.

According to the user's desiderata, other characteristics of the circuit such as the distortion, the output excursion, the area of silicon used and hence the cost, may be varied.

The invention applies, inter alia, to amplifiers mounted upstream of analogue/digital converters for video and telecom applications in so-called XDSL, ADSL, UDSL, HDSL technologies, etc.

While the embodiments of the present invention that are described above utilize specific circuit elements and control signals, many variants are possible (e.g., as a function of the type of memory being used). Thus, the values of the signals may change as a function of the different constraints dictated by the specific memory. Similarly, the timing diagrams may be highly modified as a function of the signals needed to control the memory (or memories) and as a function of the access times of the memory and the period of the clock signal. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An electronic circuit for an amplifier comprising:
   a first current mirror with an input and an output, and a first current source connected in parallel with the input of the first current mirror;
   a second current mirror with an input and an output, and a second current source connected in parallel with the input of the second current mirror;
   an upstream active element arranged between the input of the first current mirror and the input of the second current mirror, so that a current delivered to the upstream active element is equal to an output currant delivered by the output of the first current mirror and the output of the second current mirror;
   an amplifier with an input and an output, the input connected between the output of the first current mirror and the output of the second current mirror, and the output of the amplifier connected to the upstream active element so as to form a current feedback amplifier and whereby the electronic circuit exhibits a low output impedance at an output of the amplifier; and
   a downstream active element comprising a pair of capacitors mounted in series between the outputs the first current mirror and the output of the second current mirrors;
   wherein an input current of the first current mirror and au input current of the second current mirror is less than a current delivered to the upstream active element by the input of the first current mirror combined with the first current source and the input of the second current mirror combined with the second current source.

2. A current feedback amplifier circuit comprising:
   a first current mirror with an input and an output, and a first current source connected in parallel with the input of the first current mirror;
   a second current mirror with an input and an output, and a second current source connected in parallel with the input of the second current mirror; and
   an upstream active element arranged between the input of the first current mirror and the input of the second current mirror, so that a current delivered to the upstream active element is equal to an output current delivered by the output of the first current mirror and the output of the second current mirror;

wherein the output of the first current mirror and the output of the second current mirror each delivers a current $I_O$, and the input of the first current mirror and the second current mirror each delivers a current $I_O/K$, and the first and the second current sources each delivers a current $I_O \times (K-1) \times K$, where K is a proportionality factor of the first current mirror and the second current mirror.

3. The electronic circuit according to claim 2, comprising:

an amplifier with an input and an output, the input connected between the output of the first current mirror and the output of the second current mirror, and the output of the amplifier connected to the upstream active element so as to form a current feedback amplifier.

4. The electronic circuit according to claim 3, comprising;

an amplifier with the input connected between the output of the first current mirror and the output of the second current mirror so the electronic circuit exhibits a low output impedance at an output of the amplifier.

5. The electronic circuit according to claim 1, wherein the output of the first current mirror and the output of the second current mirror each delivers a current $I_O$, and the input of the first current mirror and the second current mirror each delivers a current $I_O/K$, and the first and the second current sources each delivers a current $I_O \times (K-1) \times K$, where K is a proportionality factor of the first current mirror and the second current mirror.

6. The electronic circuit according to claim 5, wherein the upstream active element comprises:

a first transistor with an emitter, a base and a collector;

a second transistor with an emitter, a base and a collector, wherein the emitter of the first transistor and the emitter of the second transistor are collected in series and the collector of the first transistor is connected to the input of the first current mirror and the collector of the second transistor is connected to the input of the second current mirror, the upstream active element providing an output at a series connection of the emitter of the first transistor and the emitter of a second transistor.

a first resistor connected between the output of the amplifier and the output of the upstream active element; and a second resistor connected between the output of the upstream active element and a ground.

7. The electronic circuit according to claim 5, wherein the input to the amplifier further comprises further comprises:

a first capacitor mounted between the output of the first current mirror and the input of the amplifier; and a second capacitor mounted between the output of the second current mirror and the input of the amplifier.

8. The electronic circuit according to claim 1, wherein the amplifier is a unity gain amplifier.

9. The electronic circuit according to claim 7, wherein the input of the amplifier is linked to a common point defined by a series connection linking the first capacitor and the second capacitor.

10. The electronic circuit according to claim 6, further comprising two biased diodes mounted in series between the base of the first transistor and the base of the second transistor, and a common point between each of the diodes forming the input to the electronic circuit.

11. The electronic circuit according to claim 1, integrated into a circuit for video and telecom technologies selected from the group of technologies consisting of XDSL, ADSL, UDSL, and HDSL.

12. A process for increasing the transimpedance of an electronic circuit comprising a first current mirror and a second current mirror, the process comprising the steps of:

placing an upstream active element between an input of the first current mirror and an input of the second current mirror, the first current mirror and the second current mirror each provided with an output;

injecting a first current from a first current source in parallel with the input of the first current mirror; and injecting a second current from a second current source in parallel with the input of the second current mirror, so that the current delivered to the upstream active element is equal to the output current of each current mirror and that the input current of each current mirror is less than the total current delivered to the upstream active element;

wherein an input current of the first current mirror and an input current of the second current mirror is less than a current delivered to the upstream active element by the input of the first current mirror combined with the fist current source and the input of the second current mirror combined with the second current source; and wherein the step of placing an upstream active element includes placing an upstream active element that receives a current $I_O$ from the output of the first current mirror and receives a current $I_O$ from the output of the second current mirror, and the current of the input of the first current mirror and the current of the second current mirror each delivers a current $I_O/K$ and wherein the steps of interjecting a first and a second current source includes interjecting a current from each of the first and the second current sources equal to $I_O \times (K-1) \times K$, where K is a proportionality factor of the first current mirror and the second current mirror.

13. A circuit in a video amplifier for improving transimpedance while keeping the slew rate (SR) and the center frequency ($F_C$) constant, comprising:

a first current mirror with an input and an output and a second current mirror with an input and an output;

a first transistor and a second transistor connected in series, each of the fist transistor and the second transistor comprising an input, an output and a biasing gate, wherein the output of each the fist transistor and the second transistor are coupled together, and the input of the first transistor is connected to the input of the first current mirror and the input of the second transistor is connected to the input of the second current mirror;

a first diode and a second diode connected in series, each of the diodes with an anode side and a cathode side, the cathode side of the first diode and the anode side of the second diode joined to form an input for the circuit therebetween, and the anode first side of the first diode connected to the biasing gate of the first transistor and the cathode side of the second diode connected to the biasing gate of the second transistor;

a first set of current sources comprising a first current source connected to the biasing gate of the first transistor, and a second current sources connected to the biasing gate of the second transistor;

a first current mirror with an input and an output, with the input of the first current mirror connected to the input of the first transistor, and a second current mirror with an input and an output, with the input of the second current mirror connected to the input of the second transistor;

an amplifier with an output and an input, the input of the amplifier connected to the outputs of the first current mirror and the second current mirror, the output of the amplifier connected to a first side of a first resistor, with a second side of the first resistor connected to the outputs of the first transistor and the second transistor, and the first side of a second resistor connected to the second side of tile first resistor, with the second side of the first resistor connected to ground; and a second set of current sources comprising a third current source connected to the input of the first transistor, and a fourth current source connected to the input of the second transistor, so that a current delivered to the input of each first transistor by the input of the first current mirror and the second transistor by the second current mirror is equal to an output current delivered by the output of the first current mirror and the output of the second current mirror.

wherein an input current of the first current mirror and an input current of the second current mirror is less than a current delivered to the input of the first transistor and the input of the second transistor by the input of the first current mirror combined with the first current source and the input of the second current mirror combined with the second current source.

14. The current feedback amplifier according to claim 3, wherein the amplifier is a unity gain amplifier.

15. The current feedback amplifier according to claim 2, wherein the upstream active element comprises:

a first transistor with an emitter, a base and a collector;

a second transistor with an emitter, a base and a collector, wherein the emitter of the first transistor and the emitter of the second transistor are connected in series and the collector of the first transistor is connected to the input of the first current mirror and the collector of the second transistor is connected to the input of the second current mirror, the upstream active element providing an output at a series connection of the emitter of the first transistor and the emitter of a second transistor;

a first resistor connected between the output of the amplifier and the output of the upstream active element; and a second resistor connected between the output of the upstream active element and a ground.

16. The current feedback amplifier according to claim 2, integrated into a circuit for video and telecom technologies selected from the group of technologies consisting of XDSL, ADSL, UDSL, and HDSL.

\* \* \* \* \*